United States Patent
Kamada

(10) Patent No.: US 10,408,420 B2
(45) Date of Patent: Sep. 10, 2019

(54) LIGHT EMITTING DEVICE WITH CONDUCTIVE MEMBERS HAVING WIDE AND NARROW PARTS, AND REFLECTING MEMBER COVERING CONDUCTIVE MEMBERS

(71) Applicant: NICHIA CORPORATION, Anan-shi, Tokushima (JP)

(72) Inventor: Kazuhiro Kamada, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 406 days.

(21) Appl. No.: 15/388,152

(22) Filed: Dec. 22, 2016

(65) Prior Publication Data
US 2017/0184278 A1    Jun. 29, 2017

(30) Foreign Application Priority Data
Dec. 26, 2015 (JP) .................. 2015-255474

(51) Int. Cl.
*F21V 19/00* (2006.01)
*H01K 1/02* (2006.01)
(Continued)

(52) U.S. Cl.
CPC .............. *F21V 7/00* (2013.01); *F21V 7/22* (2013.01); *F21V 15/01* (2013.01); *F21V 19/002* (2013.01); *F21V 23/06* (2013.01); *H01L 33/46* (2013.01); *H01L 33/62* (2013.01); *H01L 33/60* (2013.01); *H01L 2224/16225* (2013.01)

(58) Field of Classification Search
CPC ........ F21V 19/045; F21V 19/042; F21K 9/62; F21K 9/68; H05K 1/0274; H05K 1/0296
See application file for complete search history.

(56) References Cited

U.S. PATENT DOCUMENTS 5,303,122 A * 4/1994 Adams, Jr. ........... H05K 1/0295
174/261
6,936,855 B1 * 8/2005 Harrah ...................... F21K 9/00
257/59
(Continued)

FOREIGN PATENT DOCUMENTS

JP    2004-055632 A    2/2004
JP    2010-232203 A    10/2010
(Continued)

OTHER PUBLICATIONS

Extended European Search Report of the corresponding European Patent Application No. 16206645.0, dated Mar. 1, 2017.

*Primary Examiner* — Ismael Negron
(74) *Attorney, Agent, or Firm* — Global IP Counselors, LLP

(57) ABSTRACT

A light emitting device includes a light emitting element with first and second electrodes formed on the same surface side; a base with first and second conductive members, each including a wide part facing the an electrode and a narrow part extending away from the wide part; first and second bonding members each electrically connecting a corresponding electrode with a conductive member, and continuously covering the wide and narrow parts of a corresponding conductive member; and one or more light reflecting members at least partially covering the conductive members.

14 Claims, 6 Drawing Sheets

(51) Int. Cl.
*F21V 7/00* (2006.01)
*F21V 7/22* (2018.01)
*F21V 15/01* (2006.01)
*F21V 23/06* (2006.01)
*H01L 33/46* (2010.01)
*H01L 33/62* (2010.01)
*H01L 33/60* (2010.01)

(56) References Cited

U.S. PATENT DOCUMENTS

| | | | | |
|---|---|---|---|---|
| 7,434,977 | B2 * | 10/2008 | Fukasawa | G02F 1/133603 362/631 |
| 7,497,592 | B2 * | 3/2009 | Chou | G02F 1/133605 362/241 |
| 8,967,827 | B2 * | 3/2015 | Urano | F21K 9/90 362/249.02 |
| 9,166,128 | B2 * | 10/2015 | Ho | H01L 33/58 |
| 9,445,490 | B2 * | 9/2016 | Waegli | H05K 1/0204 |
| 2005/0116235 | A1 * | 6/2005 | Schultz | H01L 24/48 257/79 |
| 2007/0284600 | A1 | 12/2007 | Shchekin et al. | |
| 2007/0290328 | A1 * | 12/2007 | Lin | F21K 9/00 257/701 |
| 2009/0032829 | A1 * | 2/2009 | Chew | H01L 33/486 257/98 |
| 2009/0056985 | A1 | 3/2009 | Hirano et al. | |
| 2012/0113630 | A1 * | 5/2012 | Huo | H05B 33/0824 362/191 |
| 2013/0026507 | A1 * | 1/2013 | Chung | H01L 25/0753 257/88 |
| 2015/0062915 | A1 | 3/2015 | Hussel et al. | |
| 2015/0311414 | A1 * | 10/2015 | Lin | H01L 33/005 257/88 |

FOREIGN PATENT DOCUMENTS

| | | |
|---|---|---|
| JP | 2015-122487 A | 7/2015 |
| JP | 2016-006821 A | 1/2016 |
| WO | 2015-076281 A1 | 5/2015 |

* cited by examiner

LIGHT EMITTING DEVICE WITH CONDUCTIVE MEMBERS HAVING WIDE AND NARROW PARTS, AND REFLECTING MEMBER COVERING CONDUCTIVE MEMBERS

CROSS-REFERENCE TO RELATED APPLICATIONS

This application claims priority to Japanese Patent Application No. 2015-255474 filed on Dec. 26, 2015. The entire disclosure of Japanese Patent Application No. 2015-255474 is hereby incorporated herein by reference.

BACKGROUND

1. Technical Field

The present disclosure relates to a light emitting device.

2. Description of Related Art

As quality improvement in recent years, light emitting diodes have come to be used in various fields of applications such as general lighting, automotive lighting. There is a growing need for higher performance in light emitting devices, and even higher output and reliability are being demanded.

For example, there has been proposed a light emitting device comprising a case in which a recess is formed, metal leads disposed on the bottom face of this recess, an LED chip disposed on these metal leads, and a first sealing layer provided in the recess of the case so that the LED chip is exposed (for example, Japanese Unexamined Patent Application Publication No. 2010-232203). With this light emitting device, a light reflecting resin is provided inside the recess of the case, which improves the reflection of light emitted from the light emitting element, and prevents a drop in light extraction efficiency even though the metal leads is discolored.

A light emitting device of the disclosure includes: a light emitting element including a first electrode and a second electrode on the same face side; a base equipped with a first conductive member and a second conductive member; a first bonding member that includes a metal material as a main component and electrically connects the first electrode and the first conductive member, a second bonding member that includes a metal material as a main component and electrically connects the second electrode and the second conductive member; and one or more light reflecting members that cover at least a part of the first conductive member and the second conductive member. The first conductive member includes a first wide part faces the first electrode, and a first narrow part that extends from the first wide part and is narrower than the first wide part in a direction further away from the second electrode. The second conductive member includes a second wide part faces the second electrode, and a second narrow part that extends from the second wide part and is narrower than the second wide part in a direction further away from the first electrode. The first bonding member continuously covers the first wide part and the first narrow part. The second bonding member continuously covers the second wide part and the second narrow part. The one or more light reflecting members are each disposed in contact with the first bonding member and the second bonding member while being away from the light emitting element.

A light emitting device with increased output can be provided with certain embodiments of the present invention.

DETAILED DESCRIPTION

Figure 1A:
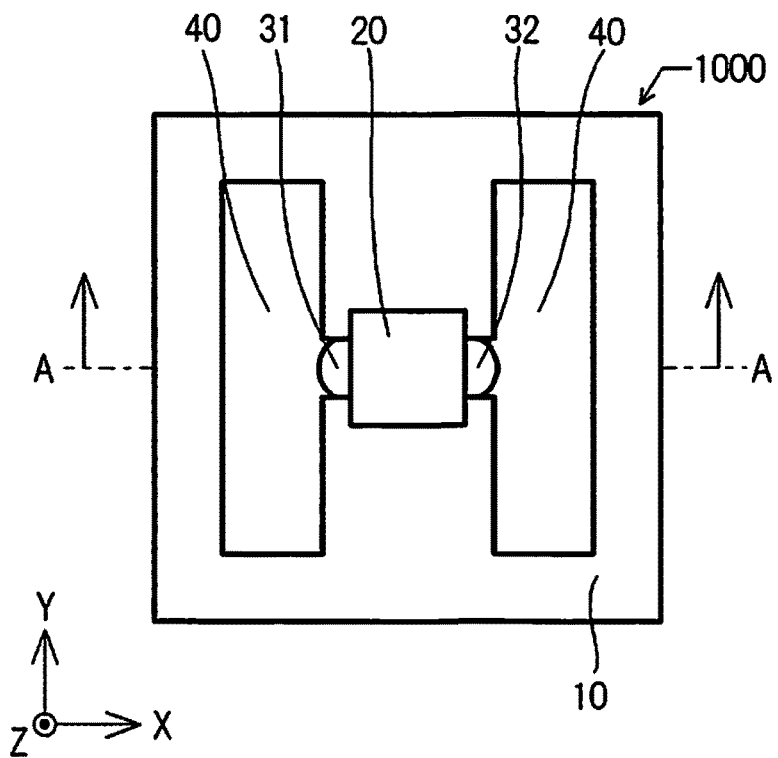
FIG. 1A illustrates a schematic plan view of the light emitting device according to Embodiment 1.

The embodiments will now be described with reference to the accompanying drawings, wherein like reference numerals designate corresponding or identical elements throughout the various drawings.

An embodiment of the present invention is described below with reference to the drawings. The following embodiment however is an example of a light emitting device embodying a technical idea of the present invention, and the present invention is not limited to the following light emitting device. Further, the present specification never specifies members in the appended claims to members to be described in the embodiment. Particularly, the dimension, material, shape, relative position, and the like of components described in the embodiment are not intended to limit the range of the present invention only thereto unless otherwise particularly specified. The size, positional relationship, and the like of the members illustrated in the drawings are sometimes exaggerated for clear description. In the description below, the identical name and numerical reference sign indicate an identical or equivalent member, and detailed description for such a member is appropriately omitted.

However, with this light emitting device as described above, the lateral faces of the light emitting element are covered by a light reflecting resin. Therefore, there is still room for improvement in terms of the light extraction efficiency of the light emitting device.

Certain embodiments according to the present invention has as its object to provide a light emitting device with improved light extraction efficiency.

Embodiment 1

A light emitting device 1000 according to Embodiment 1 of the present invention includes a light emitting element 20, a base 10, and a light reflecting member 40.

Figure 1B:
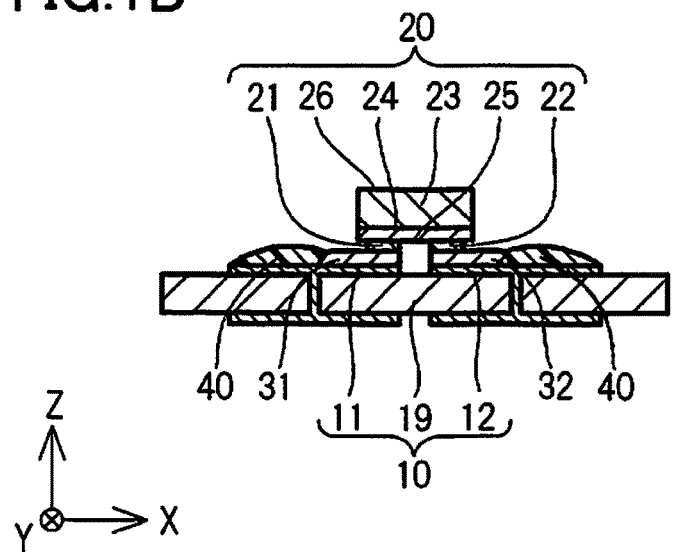
FIG. 1B illustrates a schematic cross sectional view along the A-A line in FIG. 1A.

As shown in FIG. 1B, the light emitting element 20 includes a first electrode 21 and a second electrode 22 on the same face side. The base 10 has a first conductive member 11 and a second conductive member 12. As shown in FIG. 1A, the first electrode 21 and the first conductive member 11 are electrically connected by a first bonding member 31 whose main component is a metal material. The second electrode 22 and the second conductive member 12 are electrically connected by a second bonding member 32 whose main component is a metal material.

Figure 2A:
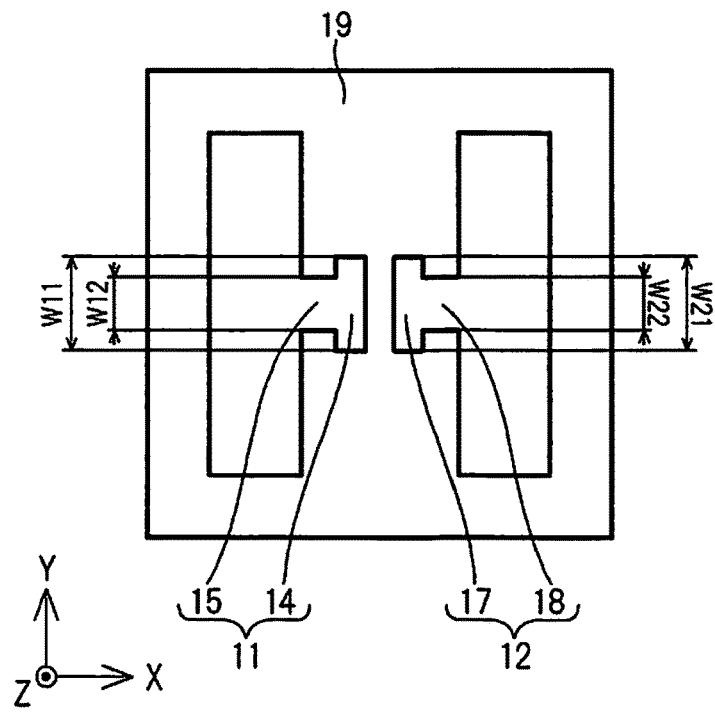
FIG. 2A illustrate a schematic plan view of the base of the light emitting device according to Embodiment 1, and FIG. 2B illustrate a schematic plan view of the light emitting device according to Embodiment 1, in which the light emitting element and the light reflecting member are not shown.

As shown in FIG. 2A, the first conductive member 11 has a first wide part 14 and a first narrow part 15. The second conductive member 12 has second wide part 17 and a second narrow part 18. As shown in FIG. 1B, the first wide part 14 faces the first electrode 21. The second wide part 17 faces the second electrode 22. The first narrow part 15 is narrower than the first wide part 14, and extends from the first wide part 14 in a direction further away from the second electrode 22. The second narrow part 18 is narrower than the second wide part 17, and extends from the second wide part 17 in a direction further away from the first electrode 21.

Figure 2B:
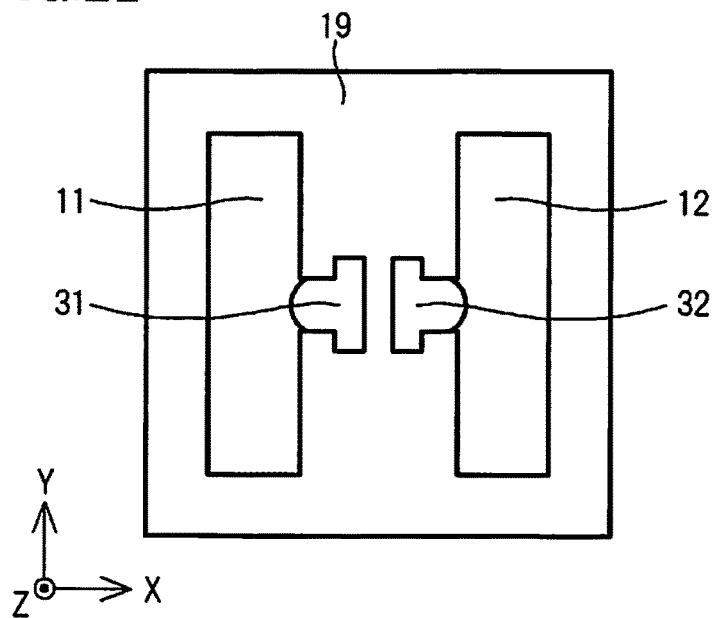

As shown in FIG. 2B, the first bonding member 31 continuously covers the first wide part 14 and the first narrow part 15. The second bonding member 32 continuously covers the second wide part 17 and the second narrow part 18. As shown in FIG. 1B, the light reflecting member 40 covers at least a part of the first conductive member 11 and a part of the second conductive member 12. Also, the light reflecting member 40 is disposed in contact with the first bonding member 31 and the second bonding member 32, while being away from the light emitting element 20.

A fusible bonding member whose main component is a metal material can be used for the first bonding member 31 and the second bonding member 32. The molten first bonding member 31 has higher wettability with respect to the first conductive member 11 than to a base 19. Therefore, the molten first bonding member 31 hardly wets and spreads on the base 19, but does wet and spread on the first conductive member 11. That is, the molten first bonding member 31 wets and spreads out in substantially the same shape of the first conductive member 11.

The molten first bonding member 31 continuously covers the first wide part 14 and the first narrow part 15, which are parts of the first conductive member 11. The first narrow part 15 has a width smaller than the width of the first wide part 14, so the molten first bonding member 31 spreads out in a smaller area on the first conductive member 11 lying in the xy plane. The molten first bonding member 31 tends to spread out in the thickness direction (i.e., the z direction), because it less likely to wet and spread over the first conductive member 11. Therefore, the first bonding member 31 can be thicker than when no first narrow part 15 is provided.

The molten second bonding member 32 has a higher wettability with respect to the second conductive member 12 than to the base 19. Therefore, the molten second bonding member 32 hardly wets and spreads on the base 19, but does wet and spread on the second conductive member 12. That is, the molten second bonding member 32 wets and spreads out in substantially the same shape of the second conductive member 12.

The molten second bonding member 32 continuously covers the second wide part 17 and the second narrow part 18, which are parts of the second conductive member 12. The second narrow part 18 has a width smaller than the width of the second wide part 17, so the molten second bonding member 32 spreads out in a smaller area on the second conductive member 12 lying in the xy plane. The molten second bonding member 32 tends to spread out in the thickness direction (the z direction), because it less likely to wet and spread on the second conductive member 12. Therefore, the second bonding member 32 can be thicker than when no second narrow part 18 is provided.

A resin member containing a light reflecting substance can be used for the material of the light reflecting member 40. After the light emitting element 20 is mounted on the base 10, the uncured light reflecting member 40 is formed so as to cover at least a part of the first conductive member 11 and a part of the second conductive member 12. The uncured light reflecting member 40 wets and spreads on the first conductive member 11 and the second conductive member 12. The uncured light reflecting member 40 has higher wettability of the first conductive member 11 and the second conductive member 12 than that of the first bonding member 31 and the second bonding member 32. Therefore, the molten, uncured light reflecting member 40 hardly wets and spreads on the first bonding member 31 and the second bonding member 32. Because the first bonding member 31 and the second bonding member 32 are thickly formed, the uncured light reflecting member 40 is blocked by the first bonding member 31 and the second bonding member 32, thereby suppressing contact with the light emitting element 20. This means that although the light reflecting member 40 does come into contact with the first bonding member 31 and the second bonding member 32, it can be formed away from the light emitting element 20.

Because the lateral surfaces of the light emitting element 20 are not in contact with the light reflecting member 40, the light extraction efficiency of the light emitting device can be improved. Also, because the lateral surfaces of the light emitting element 20 are not in contact with the light reflecting member 40, light from the lateral surfaces of the light emitting element 20 tend not to be blocked by the light reflecting member 40, so the light distribution characteristics of the light emitting device can be wider. Furthermore, the light emitting element 20 is mounted on the first bonding member 31 and the second bonding member 32, hence even though the thicknesses of the first bonding member 31 and the second bonding member 32 are increased, light from the lateral surfaces of the light emitting element 20 is less likely to be blocked by the first bonding member 31 and the second bonding member 32.

The width W12 of the first narrow part 15 refers to the width of the first narrow part 15 in a direction perpendicular to the direction in which the first narrow part 15 extends from the first wide part 14 in plan view. The width W11 of the first wide part 14 refers to the width of the first wide part 14 in a direction perpendicular to the direction in which the first narrow part 15 extends from the first wide part 14 in plan view. The width W22 of the second narrow part 18 refers to the width of the second narrow part 18 in a direction perpendicular to the direction in which the second narrow part 18 extends from the second wide part 17 in plan view. The width W21 of the second wide part 17 refers to the width of the second wide part 17 in a direction perpendicular to the direction in which the second narrow part 18 extends from the second wide part 17 in plan view.

Base 10

The base 10 is used to dispose a light emitting element, a protective element, or other such electronic components. The base 10 has an insulated base 19, and the first conductive member 11 and the second conductive member 12, which are conductive. The first conductive member 11 and the second conductive member 12 will sometimes be referred to collectively as "conductive members."

The base 19 is made of resin, ceramic, or the like. Specific Examples of the resin of the base include thermosetting resins such as an epoxy resin; a silicone resin; a BT resin, a polyimide resin, an unsaturated polyester resin; thermoplastic resins such as a polyphthalamide resin; nylon resin, a modified resin thereof and a hybrid resin which includes at least one resin or modified resin. Examples of the ceramic material include alumina, aluminum nitride. The base 19 may have a single-layer structure or a laminated structure. The base 19 may also contain a colorant, a filler, reinforcing fibers, or other such materials that are known in this field.

A member that is flexible may be used for the base 19. Polyethylene terephthalate, polyimide, glass epoxy, and other such materials can be used to advantage as a flexible member. In the case that the base 19 is flexible, it can be stored in a state in which it has been wound in a roll shape on a reel or the like, and can be attached so as to conform to curves.

The reflectivity of the base 19 located on the lower side of the light emitting element 20 with respect to the peak wavelength of the light emitting element is preferably higher than the reflectivity of the first conductive member 11 and the second conductive member 12. This means that light emitted from the light emitting element 20 will be readily reflected by the base 19, thereby increasing the light extraction efficiency of the light emitting device.

The first conductive member 11 and the second conductive member 12 are used to apply voltage from an external power supply to the light emitting element 20 and other electronic components. The first conductive member 11 and the second conductive member 12 are provided at least on a surface of the base 19 that faces the light emitting element 20. The first conductive member 11 and the second conductive member 12 may also be provided in the interior of the base 19, or to the opposite side of the base 19 from the side facing the light emitting element 20.

The first conductive member 11 has the first wide part 14 facing the first electrode 21 of the light emitting element 20, and the first narrow part 15 that extends from the first wide part 14 and is narrower than the first wide part 14 in a direction further away from the second electrode 22 of the light emitting element 20. The second conductive member 12 has the second wide part 17 facing the second electrode 22 of the light emitting element 20, and the second narrow part 18 that extends from the second wide part 17 and is narrower than the second wide part 17 in a direction further away from the first electrode 21 of the light emitting element 20.

The width of the first wide part 14 is preferably between about 0.9 and about 2.0 times the width of the first electrode 21. In the case that the width of the first wide part 14 is less than 0.9 times the width of the first electrode 21, joint strength may be reduced because the contact area between the first bonding member 31 and the first wide part 14 becomes smaller. In the case that the width of the first wide part 14 is greater than 2.0 times the width of the first electrode 21, the molten first bonding member 31 is less likely to wet and spread on the first wide part 14, so the first bonding member 31 may become thinner. The "width of the first electrode 21" refers to the width of the first electrode 21 in a direction that is perpendicular to the direction in which the first narrow part 15 extends from the first wide part 14 in plan view.

The width of the second wide part 17 is preferably between about 0.9 and about 2.0 times the width of the second electrode 22. In the case that the width of the second wide part 17 is less than 0.9 times the width of the second electrode 22, joint strength may be reduced because the contact area between the second bonding member 32 and the second wide part 17 may become smaller. In the case that the width of the second wide part 17 is greater than 2.0 times the width of the second electrode 22, the molten second bonding member 32 is less likely to wet and spread on the second wide part 17, so the second bonding member 32 may become thinner. The "width of the second electrode 22" refers to the width of the second electrode 22 in a direction that is perpendicular to the direction in which the second narrow part 18 extends from the second wide part 17 in plan view.

The first conductive member 11 and the second conductive member 12 can be formed of copper, aluminum, gold, silver, tungsten, iron, nickel, or other such metals, or of an iron-nickel alloy, phosphor bronze, or another such alloy, or the like. The thickness of each of the first conductive member 11 and the second conductive member 12 is preferably in a range of about 5 urn to 80 µm, for example.

Light Emitting Element 20

The light emitting element 20 is flip-chip mounted on the first conductive member 11 and the second conductive member 12 formed on the base 19. The emission color of light from the light emitting element 20 can be selected to have the desired wavelength depending on the application. For instance, a nitride semiconductor can be used as a blue (light with a wavelength in a range of about 430 nm to 490 nm) light emitting element. $In_XAl_YGa_{1-X-Y}N$ ($0 \leq X \leq 1$, $0 \leq Y \leq 1$, $X+Y \leq 1$) or the like can be used as this nitride semiconductor. A protective element may be mounted on the part of the first conductive member 11 and/or the second conductive member 12 where the light emitting element 20 is not mounted.

The light emitting element 20 has a support substrate 23, a semiconductor layer 24, and the first electrode 21 and second electrode 22 provided on the same surface side of the semiconductor layer 24. The surface of the light emitting element 20 having the first electrode 21 and the second electrode 22 may be termed the electrode-formed surface 25, and the surface on the opposite side from the electrode-formed surface 25 may be termed the support substrate surface 26. The support substrate 23 can be made of a light transmissive material. Therefore, light from the semiconductor layer 24 can be extracted from the lateral surfaces of the support substrate 23 and from the support substrate surface 26, which is one surface of the support substrate 23. The first electrode 21 and the second electrode 22 will sometimes be referred to collectively as "electrodes."

The light emitting element 20 is such that the electrodes, the semiconductor layer 24, and the support substrate 23 are disposed in that order on the conductive members. The shape of the first electrode 21 and the second electrode 22 can be substantially rectangular, circular, or any of various other shapes. Conductive materials known in the art can be used for the first electrode 21 and the second electrode 22.

The lateral surfaces of the light emitting element 20 are preferably located above the first narrow part 15 and the second narrow part 18. In other words, it is preferable that the lateral surfaces of the light emitting element 20 overlap the first narrow part 15 and the second narrow part 18 in plan view. This makes it easier for the molten first bonding member and second bonding member to be formed on the first narrow part 15 and the second narrow part 18. Consequently, the first bonding member and the second bonding member will tend to be thicker. The "lateral surfaces of the light emitting element 20" refers to surfaces between the support substrate surface 26 and the electrode-formed surface 25.

It is preferable that the first wide part 14 and the second wide part 17 are located inside the lateral surfaces of the light emitting element in plan view. In other words, it is preferable that the lateral surfaces of the light emitting element 20 do not overlap the first wide part 14 and the second wide part 17 in plan view.

First Bonding Member 31 and Second Bonding Member 32

The first bonding member 31 and the second bonding member 32 electrically connect the light emitting element 20 to the conductive members of the base 10, while are used to fix the light emitting element 20 on the conductive members.

The first bonding member 31 and the second bonding member 32 will sometimes be referred to collectively as "bonding members."

A fusible bonding member whose main component is a metal material can be used for the first bonding member 31 and the second bonding member 32. Materials known in the art can be used for the first bonding member 31 and the second bonding member 32, examples of which include Sn—Cu, Sn—Ag—Cu, Au—Sn, and other types of solder.

The first bonding member 31 is disposed so as to be interposed between at least the first electrode 21 and the first wide part 14, and to continuously cover the first wide part 14 and the first narrow part 15. The second bonding member 32 is disposed so as to be interposed between at least the second electrode 22 and the second wide part 17, and to continuously cover the second wide part 17 and the second narrow part 18.

The width of the first narrow part 15 is preferably 0.3 to 0.8 times the width of the first wide part 14, and more preferably 0.4 to 0.6 times. Keeping the width of the first narrow part 15 within this range improves heat dissipation and helps increase the thickness of the first bonding member 31. The width of the second narrow part 18 is preferably 0.3 to 0.8 times the width of the second wide part 17, and more preferably 0.4 to 0.6 times. Keeping the width of the second narrow part 18 within this range improves heat dissipation and helps increase the thickness of the second bonding member 32.

The thickness of each of the first bonding member 31 and the second bonding member 32 is preferably in a range of about 10 µm to about 200 µm. In the case that the thickness of each of the first bonding member 31 and the second bonding member 32 is greater than 10 µm, this will tend to keep the uncured light reflecting member 40 from coming into contact with the light emitting element 20. When the thickness of each of the first bonding member 31 and the second bonding member 32 is less than 200 µm, force exerted during operation, etc., is less likely to produce cracks in the first bonding member 31 and the second bonding member 32.

Light Reflecting Member 40

The light reflecting member 40 is used to reflect the light emitted from the light emitting element 20, and covers at least part of the first conductive member 11 and the second conductive member 12. The reflectivity of the light reflecting member 40 with respect to the peak wavelength of the light emitting element 20 is higher than the reflectivity of the first conductive member 11 and the second conductive member 12 with respect to the peak wavelength of the light emitting element 20, and this affords higher light extraction efficiency in the light emitting device.

Covering the first conductive member 11 and the second conductive member 12 with the light reflecting member 40 enables the first conductive member 11 and the second conductive member 12 to be less discolored, thereby alleviating a decrease in the light extraction efficiency of the light emitting device.

A resin member containing a light reflecting substance can be used as the material of the light reflecting member 40. Examples of this resin material of the light reflecting member 40 include an epoxy resin, a silicone resin, a modified silicone resin, an urethane resin, an oxetane resin, a fluororesin, an acrylic resin, a polycarbonate resin, a polyimide resin, and a polyphthalamide resin. Examples of light reflecting substances include titanium oxide, zirconia, aluminum oxide, and silicon oxide.

After the light emitting element 20 has been placed on the base 10 via the first bonding member 31 and the second bonding member 32, the uncured light reflecting member 40 is formed near the light emitting element 20 and on the first conductive member and the second conductive member. The light reflecting member 40 is then formed by curing. The uncured light reflecting member 40 wets and spreads on the first conductive member 11 and the second conductive member 12, and may come into contact with the light emitting element 20. The light reflecting member 40 is used to reflect the light of the light emitting element 20, but when it is in contact with the light emitting element 20, light emitted from the light emitting element 20 is blocked by the light reflecting member 40, hence this may reduce the light extraction efficiency of the light emitting device.

The first conductive member 11 has the first wide part 14 and the first narrow part 15, and the second conductive member 12 has the second wide part 17 and the second narrow part 18, therefore the first bonding member 31 and the second bonding member 32 tend to be thicker as mentioned above. Accordingly, even though the uncured light reflecting member 40 wets and spreads on the first conductive member 11 and the second conductive member 12, it will be blocked by the thick first bonding member 31 and second bonding member 32, making it less likely that the light reflecting member 40 comes into contact with the light emitting element 20. With respect to the uncured light reflecting member 40, the wettability of the first bonding member 31 and the second bonding member 32 is lower than that of the first conductive member 11 and the second conductive member 12. Because the uncured light reflecting member 40 is less likely to wet and spread on the first bonding member 31 and the second bonding member 32, the uncured light reflecting member 40 and the light emitting element 20 disposed on the first bonding member 31 and the second bonding member 32 less likely to come into contact. Consequently, the light reflecting member 40 does come into contact with the first bonding member 31 and the second bonding member 32, but is formed away from the light emitting element 20.

The light reflecting member 40 preferably covers the entire surface of the first conductive member 11 and the second conductive member 12 provided on the surface of the base 19 that faces the light emitting element 20. This reduces discoloration of the first conductive member 11 and the second conductive member 12, thereby alleviating a decrease in the light extraction efficiency of the light emitting device.

Figure 3A:
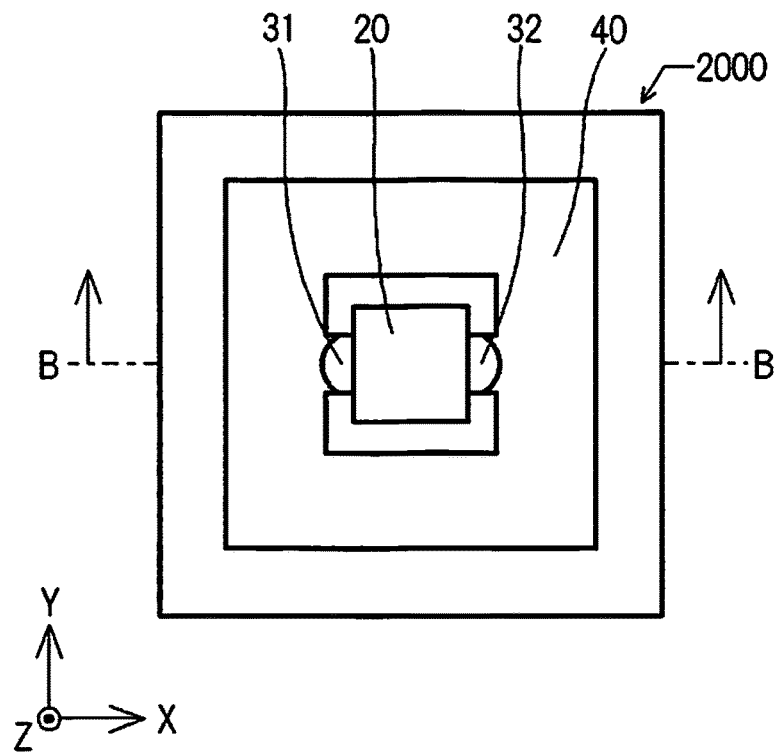
FIG. 3A illustrate a schematic plan view of the light emitting device according to Embodiment 2, and FIG. 3B illustrate a schematic cross sectional view the B-B line in FIG. 3A.

There may be just one light reflecting member 40, or there may be two or more. As shown in FIG. 1A, there may be two light reflecting members 40 that respectively cover the first conductive member 11 and the second conductive member 12. As shown in FIG. 3A discussed below, a single light reflecting member 40 may cover the first conductive member 11, the second conductive member 12, and the base 19.

Embodiment 2

Figure 3B:
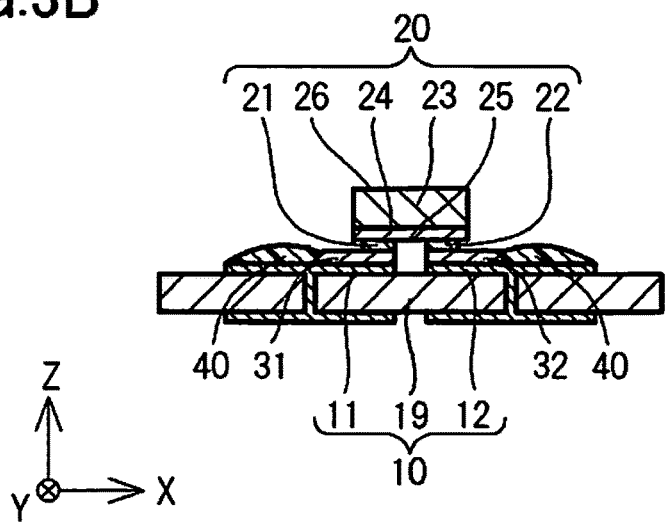

The light emitting device 2000 according to the embodiment shown in FIGS. 3A and 3B differs from the light emitting device 1000 according to Embodiment 1 in the shapes of the first conductive member 11 and the second conductive member 12 and in that the light reflecting member 40 surrounds the light emitting element 20. In all other respects, the light emitting device according to Embodiment 2 is the same as Embodiment 1.

As shown in FIG. 3A, the light reflecting member 40 is formed to surround the light emitting element 20. As a result, the light reflecting member 40 more easily covers the base 19 and the first conductive member 11 and the second conductive member 12 located near the light emitting element 20 in plan view. Consequently, it is even less likely that light emitted from the light emitting element 20 is absorbed by the base 19 and the first conductive member 11 and the second conductive member 12, thereby improving the light extraction efficiency of the light emitting device.

A larger surface area of the first conductive member 11 and the second conductive member 12 is preferable because heat dissipation is facilitated. By disposing the first conductive member 11 and/or the second conductive member 12 to surround the light emitting element 20, the surface area of the first conductive member 11 and the second conductive member 12 tends to be larger.

Figure 4A:
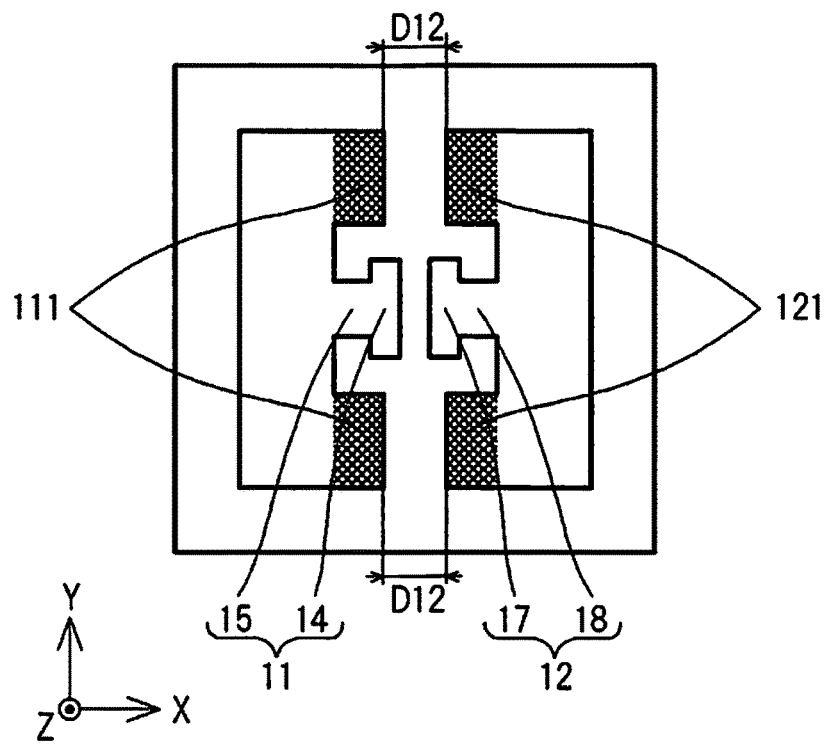
FIG. 4A illustrate a schematic plan view of the base of the light emitting device according to Embodiment 2, and FIG. 4B illustrate a schematic plan view of the light emitting device according to Embodiment 2, in which the light reflecting member are not shown.
Figure 4B:
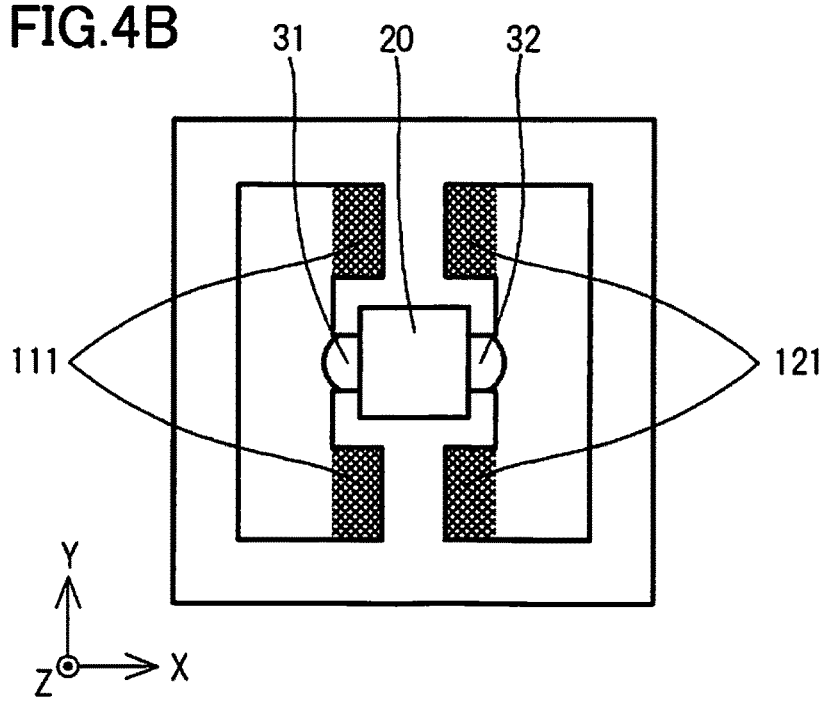

For example, as shown in FIG. 4A, the first conductive member 11 preferably has a first convex part 111 disposed to at least partially surround the light emitting element 20. The first convex part 111 is part of the first conductive member 11 disposed in a direction in which the distance from the second conductive member 12 is shorter. Also, the second conductive member 12 preferably has a second convex part 121 disposed to at least partially surround the light emitting element 20. The second convex part 121 is part of the second conductive member 12 disposed in a direction in which the distance from the first conductive member 11 is shorter. FIG. 3A is a diagram in which the light reflecting member 40 is formed in FIG. 4B. The first convex part 111 and the second convex part 121 are located on the lower surface of the light reflecting member 40. Therefore, in plan view the first convex part 111 and the second convex part 121 are not shown. The presence of the first convex part 111 and the second convex part 121 increases the surface area of the first conductive member 11 and the second conductive member 12 and tends to improve the heat dissipation of the light emitting device. Because the first convex part 111 and the second convex part 121 are located on the lower surface of the light reflecting member 40, discoloration of the first conductive member 11 and the second conductive member 12 are less likely to be discolored, thereby alleviating a decrease in the light extraction efficiency of the light emitting device.

There may be just one first convex part 111, or there may be two or more. As shown in FIG. 4A, when there are two first convex parts 111, they are preferably formed so that the first wide part 14 and the first narrow part 15 are disposed between the first convex parts 111. This makes it easier for the first convex part 111 to be covered by the light reflecting member 40.

There may be just one second convex part 121, or there may be two or more. As shown in FIG. 4A, when there are two second convex parts 121, they are preferably formed so that the second wide part 17 and the second narrow part 18 are disposed between the second convex parts 121. This makes it easier for the second convex part 121 to be covered by the light reflecting member 40.

A shortest distance D12 between the first conductive member 11 and the second conductive member 12 located on the lower surface of the light reflecting member 40 is preferably in a range of about 0.2 mm to about 0.6 mm. When the shortest distance D12 between the first conductive member 11 and the second conductive member 12 located on the lower surface of the light reflecting member 40 is at least 0.2 mm, short circuiting between the first conductive member 11 and the second conductive member 12 is less likely to occur. When the shortest distance D12 between the first conductive member 11 and the second conductive member 12 located on the lower surface of the light reflecting member 40 is no more than 0.6 mm, the surface area of the first conductive member 11 and the second conductive member 12 can be increased, which helps improve heat dissipation.

Embodiment 3

Figure 5A:
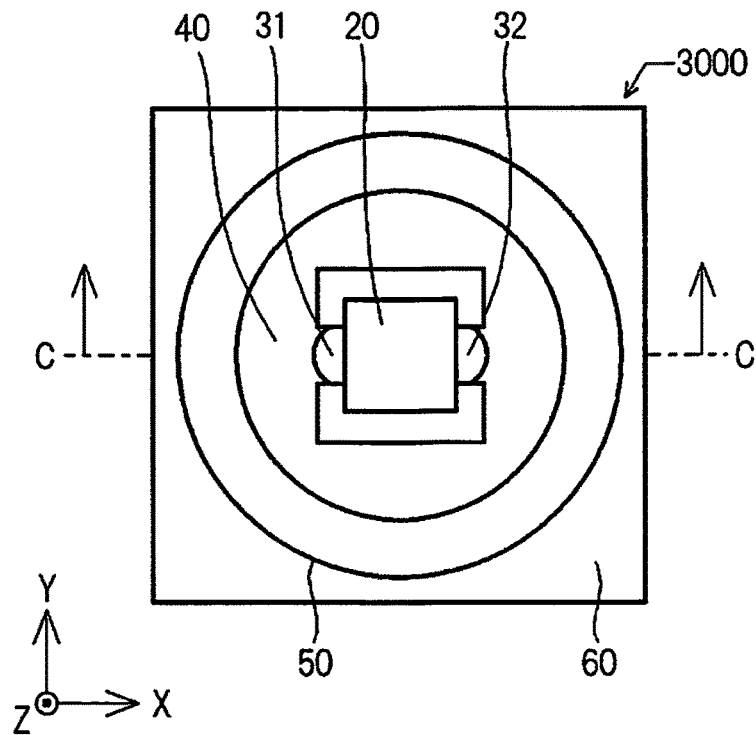
FIG. 5A illustrate a schematic plan view of the light emitting device according to Embodiment 3 and FIG. 5B illustrate a schematic cross sectional view along the C-C line in FIG. 5A.
Figure 5B:
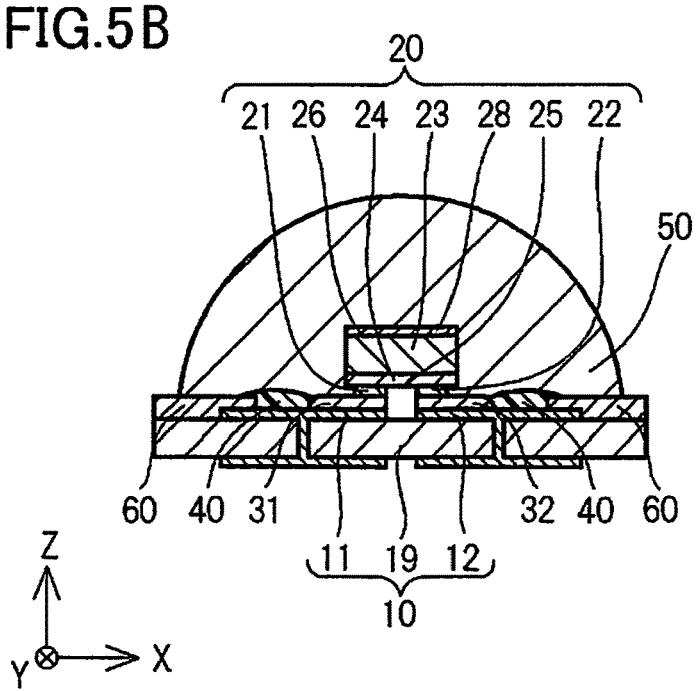

The light emitting device 3000 according to the embodiment shown in FIGS. 5A and 5B differs from the light emitting device 2000 according to Embodiment 2 in the presence of a covering member 60, the light reflecting film 28 and an encapsulant 50. In all other respects, the light emitting device 3000 according to Embodiment 3 is the same as Embodiment 2.

Covering Member 60

Figure 6A:
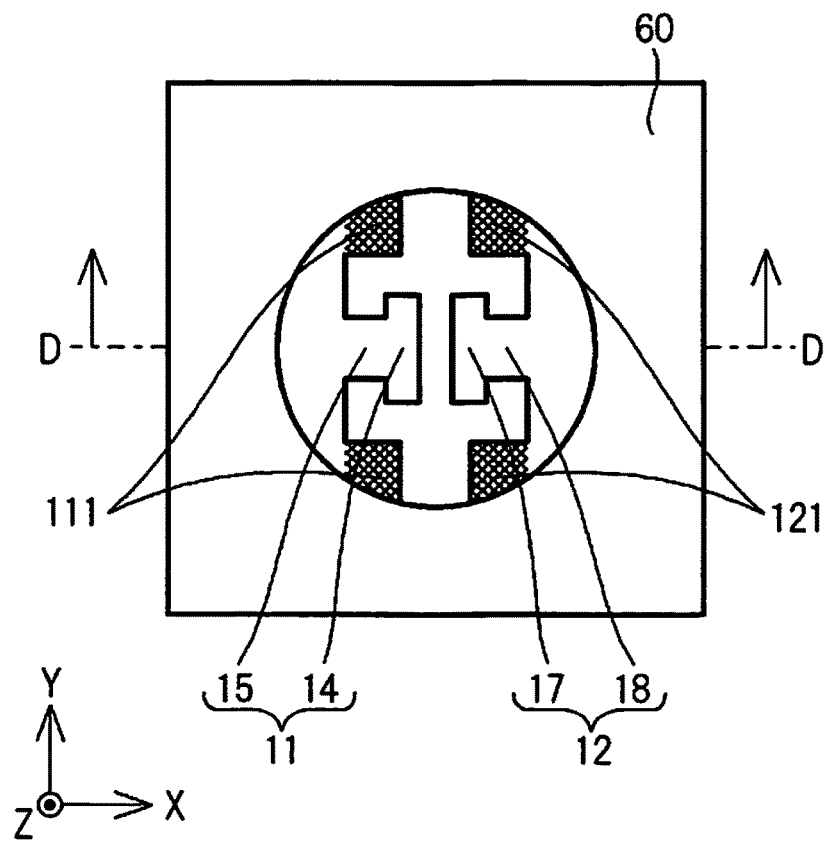
FIG. 6A illustrate a schematic plan view of the base and covering member of the light emitting device according to Embodiment 3, and FIG. 6B illustrate a schematic cross sectional view along the D-D line in FIG. 6A.
Figure 6B:
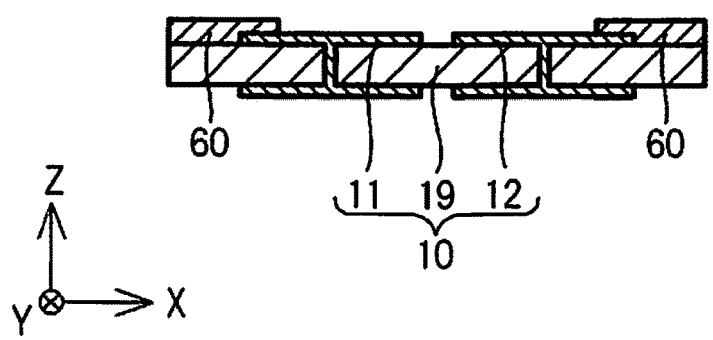

The covering member 60 has light reflecting characteristics, and covers at least a part of the first conductive member 11 and the second conductive member 12 located on the outside of the light reflecting member 40. Also, the covering member 60 is formed away from the light emitting element 20. FIGS. 6A and 6b are diagrams in which the covering member 60 is formed on the base 10 shown in FIG. 4A. Because the covering member 60 is formed away from the light emitting element 20, it is preferable to form the covering member 60 before the light emitting element 20 is placed on the base 10. This reduces the force exerted on the light emitting element 20 during the manufacture of the light emitting device.

The covering member 60 can be a resin member containing a light reflecting substance that reflects the light emitted from the light emitting element 20. It is suitable for this material to be an insulated white ink known as a white resist made of a silicone resin, which contains titanium oxide, but other materials can be used instead.

The presence of the covering member 60 makes it less likely that light emitted from the light emitting element 20 is absorbed by the base 19, the first conductive member 11, and the second conductive member 12, therefore the light extraction efficiency of the light emitting device can be improved. Also, because a part of the first conductive member 11 and the second conductive member 12 is covered by the covering member 60, the surface area on which the light reflecting member 40 is formed can be smaller.

When the covering member 60 is provided, as shown in FIGS. 5A and 5b, it is preferable for the light reflecting member 40, the covering member 60, the first bonding member 31, and the second bonding member 32 to cover the entire surface of the first conductive member 11 and the second conductive member 12 provided on the surface of the base 19 that is opposite the light emitting element 20. This reduces discoloration of the first conductive member 11 and the second conductive member 12, thereby alleviating a decrease in the light extraction efficiency of the light emitting device.

As shown in FIG. 5A, the covering member 60 is preferably formed to surround the light emitting element 20. This makes it easier for the covering member 60 to cover the base 19, the first conductive member 11, and the second conductive member 12 located near the light emitting element 20 in plan view. Consequently, the light emitted from the light emitting element 20 is less likely to be absorbed by the base 19, the first conductive member 11, and the second conductive member 12, therefore the light extraction efficiency of the light emitting device can be further enhanced.

The light reflecting member 40 is formed after the mounting of the light emitting element 20, thereby being formed at a location closer to the light emitting element than the covering member 60. Also, when the light reflecting member 40 and the covering member 60 are formed on the conductive members, and disposed in that order from the conductive members.

A shortest distance between the covering member 60 and the light emitting element 20 in plan view is preferably in a range of about 0.3 mm to about 1.0 mm. By providing at least about 0.3 mm of distance between the covering member 60 and the light emitting element 20, the light emitting element is less likely to be mounted on the covering member 60 even though there is variation in the shape of the covering member 60 or the mounting location of the light emitting element. Because electricity does not flow through the covering member 60, the light emitting element 20 may not be lit in the case of being placed on the covering member 60. When the shortest distance between the covering member 60 and the light emitting element 20 is less than 1.0 mm, the surface area on which the covering member 60 covers the first conductive member 11 and the second conductive member 12 is larger, therefore the light extraction efficiency of the light emitting device can be increased.

Light Reflecting Film 28

The light emitting element 20 may have the light reflecting film 28 that covers the support substrate surface 26. The light reflecting film 28 is used to reflect the light emitted from the light emitting element 20. With the light reflecting film 28 that covers the support substrate surface 26, light emitted from the light emitting element 20 is less likely to be extracted from the support substrate surface 26, and more likely to be extracted from the lateral surfaces between the electrode-formed surface 25 and the support substrate surface 26. Consequently, a light emitting element equipped with the light reflecting film 28 may have broader light distribution characteristics than a light emitting element not equipped with the light reflecting film 28.

The light reflecting film 28 can have, for example, a multilayer structure formed of a plurality of dielectric layers, which are laminated on an underlayer including an oxide film or the like. The plurality of dielectric layers may include a plurality of sets of a low refractive index layer and a high refractive index layer. This allows light of a specific wavelength to be selectively reflected. More specifically, the dielectric layers can be alternately stacked, each of which has different refractive index to each other and has a thickness to reflect a quarter of wavelength of light emitted from the light emitting element. Consequently, the dielectric multilayer films can reflect the predetermined wavelength in a highly efficient manner. Examples of the material include one or more types of oxide or nitride selected from the group consisting of silicon, titanium, zirconium, niobium, tantalum, and aluminum. When the light reflecting film is formed from an oxide film, the low refractive index layer can be $SiO_2$, for example, and the high refractive index layer can be $Nb_2O_5$, $TiO_2$, $ZrO_2$, $Ta_2O_5$, or the like, for example. More specifically, an example is $(Nb_2O_5/SiO_2)$ n, in this order from the underlayer, where n is 2 to 5. The total thickness of the light reflecting film is preferably in a range of about 0.2 µm to about 1 µm.

Encapsulant 50

There may be the encapsulant 50 that covers the light emitting element 20. The encapsulant 50 serves to protect the light emitting element 20 against dust, moisture, external force, and so on. The encapsulant 50 preferably covers the first bonding member 31, the second bonding member 32, and the light reflecting member 40. When the covering member 60 is provided, the encapsulant 50 preferably covers at least a part of the covering member 60, the purpose of which is for the encapsulant 50 to protect the part against dust, moisture, external force, and so on. The encapsulant 50 preferably covers the entire surface of the light emitting element 20, the first bonding member 31, the second bonding member 32, and the light reflecting member 40.

Light transmissive materials known in the art can be used for the encapsulant 50 in order for light from the light emitting element 20 to be exited to an outside. Example materials of the encapsulant 50 include a silicone resin and an epoxy resin.

The shape of the encapsulant 50 is preferably substantially hemispherical. This allows light emitted from the light emitting element 20 to be readily extracted to the outside, thereby improving the light extraction efficiency of the light emitting device.

The encapsulant 50 may contain a light scattering material or a wavelength conversion material. When the encapsulant 50 contains a light scattering material, light emitted from the light emitting element 20 can be scattered by this material, which reduces non-uniform luminance. The light scattering material is able to scatter the light by making use of the difference in its refractive index from that of the encapsulant 50. A publicly known material can be used for the light scattering material, examples of which include barium sulfate, titanium oxide, aluminum oxide, and silicon oxide. Adding a light scattering material reduces non-uniform luminance at the surface of the encapsulant.

The wavelength conversion material is used to convert light with a first peak wavelength emitted by the light emitting element 20 into light with a second peak wavelength that is difference from the first peak wavelength. A phosphor may be used as the wavelength conversion material. A phosphor that is known in the art can be used. Examples include a YAG phosphor that is activated with cerium, a LAG phosphor that is activated with cerium, a silicate-based phosphor that is activated with europium, a nitride-based phosphor (based on CASN, SCASN, α-SiAlON, or β-SiAlON), a halogen-based phosphor (based on a chlorosilicate or KSF), and a sulfide-based phosphor. Quantum dots may also be used. Two or more types of these phosphors may also be used in combination.

In particular, for a light emitting device used in a liquid crystal display, a television backlight, or another such display device, it is preferable to use a combination of a β-SiAlON phosphor and an SCASN phosphor. For lighting applications, it is preferable to use a combination of a YAG-based or LAG-based phosphor and a SCASN or CASN phosphor.

Method for Manufacturing Light Emitting Device

The method for manufacturing a light emitting device according to Embodiment 3 will now be described.

Step 1. Connection of the Light Emitting Element to the Base

The base 10 includes the first conductive member 11 and the second conductive member 12 is provided. The base 10 may include the covering member 60 that covers the first conductive member 11, the second conductive member 12, and the base 19 except where the light emitting element 20 is mounted. The covering member 60 may be formed by printing, spraying, or another such known method.

The first electrode 21 of the light emitting element 20 is placed on the first conductive member 11 via the uncured first bonding member 31, and the second electrode 22 of the light emitting element 20 is placed on the second conductive member 12 via the uncured second bonding member 32.

The first conductive member 11 includes the first wide part 14 facing the first electrode 21 of the light emitting element 20, and the first narrow part 15, which extends from the first wide part 14 and is narrower than the first wide part 14 in a direction further away from the second electrode 22 of the light emitting element 20. The second conductive member 12 includes the second wide part 17 facing the second electrode 22 of the light emitting element 20, and the second narrow part 18, which extends from the second wide part 17 and is narrower than the second wide part 17 in a direction further away from the first electrode 21 of the light emitting element 20.

The uncured first bonding member 31 is provided at least on the first wide part 14. The uncured second bonding member 32 is provided at least on the second wide part.

The uncured first bonding member 31 and second bonding member 32 are heated and melted by reflow or another known method, and are then cooled, so that the first electrode 21 and the first conductive member 11 are fixed by the first bonding member 31, and the second electrode 22 and the second conductive member 12 are fixed by the second bonding member 32.

The molten first bonding member 31 wets and spreads on the first wide part 14 and the first narrow part 15. However, because the first narrow part 15 is narrower in width than the first wide part 14, its surface area on which the molten first bonding member 31 spreads is smaller. The molten first bonding member 31 readily thickened in the thickness direction corresponding to the amount by which it does not wet and spread on the first conductive member 11. Accordingly, the presence of the first narrow part 15 tends to make the first bonding member 31 thicker.

The molten second bonding member 32 wets and spreads on the second wide part 17 and the second narrow part 18. However, because the second narrow part 18 is narrower in width than the second wide part 17, its surface area on which the molten second bonding member 32 spreads is smaller. The molten second bonding member 32 readily thickened in the thickness direction corresponding to the amount by which it does not wet and spread on the second conductive member 12. Accordingly, the presence of the second narrow part 18 tends to make the second bonding member 32 thicker.

Step 2. Formation of the Light Reflecting Member

The uncured light reflecting member 40 is discharged from a nozzle to coat the first conductive member 11 and the second conductive member 12 around the light emitting element 20. The uncured light reflecting member 40 is disposed away from the light emitting element 20.

The viscosity of the uncured resin member of the light reflecting member 40 is preferably in a range of about 1 Pa·s to about 20 Pa·s, and more preferably in a range of about 3 Pa·s to about 12 Pa·s. Keeping the viscosity of the resin member within this range makes it easier to control the shape of the uncured resin member, and makes it easier for the uncured resin member to wet and spread on the first conductive member and the second conductive member.

The uncured light reflecting member 40 wets and spreads on the first conductive member 11 and the second conductive member 12, but the uncured light reflecting member 40 is less likely to be in contact with the light emitting element 20 due to the thicknesses of the first and the second bonding members. That is, the first bonding member 31 and the second bonding member 32 dam up the uncured light reflecting member 40 and make it less likely to come into contact with the light emitting element 20.

The light reflecting member 40 is cured by heating the uncured light reflecting member 40 with an oven or by some other known method. The light reflecting member 40 may be completely cured, but in the case of including a encapsulant formation step discussed below, it may be just semi-cured enough to hold the shape of the uncured light reflecting member 40.

Step 3. Formation of a Encapsulant

The encapsulant 50 that covers the light emitting element 20 is formed. The uncured encapsulant 50 is formed to coat the light emitting element 20. After this, the uncured encapsulant 50 is heated with an oven or by some other known method to cure the encapsulant 50.

In the case of using a resin material for the encapsulant 50, the viscosity of the uncured (i.e., liquid) resin material is preferably in a range of about 10 Pa·s to 1000 Pa·s, and more preferably in a range of about 150 Pa·s to 600 Pa·s. Keeping the viscosity within this range makes it easier to adjust the shape of the encapsulant 50 to be hemispherical, etc.

INDUSTRIAL APPLICABILITY

The light emitting device of the present invention can be used for a wide range of applications such as a back light source of a liquid crystal display, various lighting fixtures, various display devices, projector devices and image reading devices such as facsimile machines, copying machines, scanners.

What is claimed is:

1. A light emitting device, comprising:
a light emitting element including a first electrode and a second electrode on the same surface side;
a base equipped with a first conductive member and a second conductive member;
a first bonding member that includes a metal material as a main component and electrically connects the first electrode and the first conductive member,
a second bonding member that includes a metal material as a main component and electrically connects the second electrode and the second conductive member; and
one or more light reflecting members that cover at least a part of the first conductive member and the second conductive member,
wherein the first conductive member includes a first wide part facing the first electrode, and a first narrow part that extends from the first wide part and is narrower than the first wide part in a direction further away from the second electrode,
the second conductive member has a second wide part facing the second electrode, and a second narrow part that extends from the second wide part and is narrower than the second wide part in a direction further away from the first electrode, the first bonding member continuously covers the first wide part and the first narrow part, the second bonding member continuously covers the second wide part and the second narrow part, and the one or more light reflecting members are each disposed in contact with the first bonding member and the second bonding member while being away from the light emitting element.

2. The light emitting device according to claim 1, wherein the light reflecting member surrounds the light emitting element.

3. The light emitting device according to claim 1, wherein the light reflecting member is a resin member containing a light reflecting substance.

4. The light emitting device according to claim 1, wherein a reflectivity of the light reflecting member with respect to a peak wavelength of light from the light emitting element is higher than a reflectivity of the first conductive member and the second conductive member.

5. The light emitting device according to claim 1, wherein at least a part of the first conductive member and the second conductive member located outside of the light reflecting member is covered by a covering member containing a light reflecting substance.

6. The light emitting device according to claim 1, wherein the lateral surfaces of the light emitting element are located above the first narrow part and the second narrow part.

7. The light emitting device according to claim 1, wherein a reflectivity of a base located on the lower side of the light emitting element with respect to a peak wavelength of light from the light emitting element is higher than the reflectivity of the first conductive member and the second conductive member.

8. The light emitting device according to claim 1, wherein the base is flexible.

9. The light emitting device according to claim 1, wherein the first bonding member and the second bonding member are solder.

10. The light emitting device according to claim 1, further comprising a light reflecting film that covers the support substrate surface of the light emitting element.

11. The light emitting device according to claim 1, further comprising a hemispherical encapsulant that covers the light emitting element.

12. The light emitting device according to claim 1, wherein the width of the first wide part is 0.9 to 2.0 times the width of the first electrode.

13. The light emitting device according to claim 1, wherein the width of the first narrow part is 0.3 to 0.8 times the width of the first wide part.

14. The light emitting device according to claim 1, wherein a thickness of each of the first bonding member and the second bonding member is in a range of 10 μm to 200 μm.

* * * * *